United States Patent [19]

Ferrier et al.

[11] Patent Number: 5,518,760
[45] Date of Patent: May 21, 1996

[54] COMPOSITION AND METHOD FOR SELECTIVE PLATING

[75] Inventors: Donald Ferrier, Thomaston; Eric Yakobson, Waterbury, both of Conn.

[73] Assignee: MacDermid, Incorporated, Waterbury, Conn.

[21] Appl. No.: 409,673

[22] Filed: Mar. 22, 1995

Related U.S. Application Data

[63] Continuation-in-part of Ser. No. 324,114, Oct. 14, 1994, Pat. No. 5,468,515.
[51] Int. Cl.[6] ...................................................... B05D 5/12
[52] U.S. Cl. .............................................. 427/98; 422/304
[58] Field of Search ........................ 427/97, 98, 304–306

[56] References Cited

U.S. PATENT DOCUMENTS

| | | | |
|---|---|---|---|
| 4,863,758 | 9/1989 | Rhodenizer | 427/97 |
| 4,940,181 | 7/1990 | Juskey, Jr. et al. | 228/180.2 |
| 5,160,579 | 11/1992 | Larson | 156/661.1 |
| 5,173,130 | 12/1992 | Kinoshita et al. | 148/268 |
| 5,235,139 | 8/1993 | Bingston et al. | 174/257 |
| 5,468,515 | 11/1995 | Ferrier | 427/98 |

*Primary Examiner*—Sam Silverberg
*Attorney, Agent, or Firm*—John L. Cordani

[57] ABSTRACT

This invention proposes the addition of imidazole and imidazole derivatives to various activator solutions for the selective activation and plating of metallic surfaces. The invention is particularly useful in plating exposed copper surfaces on printed circuit boards without substantial extraneous plating on the solder mask surfaces.

9 Claims, No Drawings

COMPOSITION AND METHOD FOR SELECTIVE PLATING

This application is a continuation-in-part of U.S. patent application Ser. No. 08/324,114, filed on Oct. 14, 1994, now U.S. Pat. No. 5,468,515.

FIELD OF THE INVENTION

This invention relates generally to a composition and method for activating surfaces for the autocatalytic deposition of metal deposits. The invention is particularly useful in selectively activating the copper surfaces of printed circuit boards for the reception of electroless nickel-phosphorus plating thereon.

BACKGROUND ART

The activation of various types of surfaces with solutions or colloids containing precious metals such as palladium, gold and silver has been known for quite some time. The most rudimentary activators consisted essentially of precious metals, most predominantly palladium, in aqueous solutions. A typical activation composition of this type might consist of an aqueous solution of palladium chloride, sodium chloride, and hydrochloric acid. The surface to be activated was merely dipped into this activating composition, rinsed, then electrolessly plated. These type activation compositions are still in use today.

The next generation of activator systems consisted of two sequential steps. The first step consisted of a solution of a Group IV metal ion reducing agent, such as stannous ion, which solution applied a film of this reducing metal ion to the surface to be activated. The second step consisted of an aqueous solution of a precious metal, most predominantly. Thus, the initial Group IV metal ion reducing agent reduced precious metal ions to their zero valence state on the surface. The surface was then electrolessly plated.

More recent advances in activation involve the combination of the two-step activating systems into a single step. These single step activators consist mainly of tin-palladium colloids. A recent improvement to these generic tin-palladium colloidal activators is described in U.S. Pat. No. 4,863,758, the teachings of which are incorporated herein by reference in their entirety.

Regardless of the exact nature of these prior art activators, they all share at least one characteristic in common in that they all activate a variety of surfaces indiscriminately. This is particularly true in the area of printed circuit boards. These activators are used extensively to activate both the metallic and the plastic (usually epoxy-glass) surfaces of printed circuit boards for subsequent electroless metal plating. These activator compositions activate both types of surfaces indiscriminately, however, in many cases this indiscriminate nature of activation causes difficulty and/or inefficiency in the manufacture of printed circuit boards. In particular, in some cases, it is desirable to activate the metallic surfaces (usually copper or nickel) on the printed circuit board, but not the plastic surfaces, thus enabling selective plating on the metallic surfaces as opposed to the plastic surfaces.

This is particularly true in the plating of exposed metallic areas of the circuits after a majority of the board surface has been covered by solder mask (for a discussion of soldermasks please see U.S. Pat. No. 5,296,334, Castaldi et al., the teachings of which are incorporated herein by reference in their entirety). Generally, at this point, the manufacture of the circuit board is almost complete. The circuits and through-holes, if any, have been defined and plated, and the board itself has been coated with a permanent layer of solder mask. The solder mask generally covers all areas of the board, except for the holes, vias, pads, tabs, lands, and other areas of connection (collectively "areas of connection"). These areas of connection are usually copper or nickel areas which are exposed in order for subsequent connections of the components to be made thereto. These copper areas of connection require further treatment to protect or enhance their solderability or their ability to make other types of connection in a reliable manner.

Several methods of treatment of these areas have been proposed. Some proposals involve coating or pre-coating these areas with solder as described in U.S. Pat. No. 5,160,579, the teachings of which are incorporated by reference herein in their entirety. Other proposals involve the treatment of these copper surfaces with various organic pre-fluxes or anti-corrosion agents as described in U.S. Pat. No. 5,173,130, the teachings of which are incorporated by reference herein in their entirety. By far, however, the most popular way of treating these areas of connection is by overplating the copper with a barrier layer usually consisting of a metal such as nickel, followed by a second overplating with a precious metal such as gold, palladium or rhodium ("nickel-gold process" generally). These processes are aptly explained in U.S. Pat. Nos. 4,940,181 and 5,235,139, the teachings of which are both incorporated herein by reference in their entirety.

One of the difficulties with nickel-gold processes is that the copper surfaces are not catalytic to the electroless nickel-phosphorous baths which are used. U.S. Pat. No. 5,235,139, the teachings of which are incorporated herein by reference in their entirety, teaches the use of a nickel-boron coating prior to the nickel-phosphorous coating in an attempt to make the surface catalytic to the nickel-phosphorous bath. This approach is widely used but improvements are still desirable since incomplete coverage is still sporadically and unpredictably observed in the absence of a separate activation step.

It should be pointed out that various palladium or precious metal activators will activate copper surfaces for the reception of electroless nickel-phosphorous, but they will also indiscriminately activate other areas of the board on which plating is not desirable in this application. The current invention then addresses this concern and proposes an activator which will selectively activate the copper surfaces and thereby minimize or eliminate extraneous plating.

SUMMARY OF THE INVENTION

The current invention proposes a new composition and process for activating surfaces for the auto catalytic deposition of metal deposits. The invention further proposes a composition and process for selectively activating certain surfaces and not other surfaces. The invention is particularly useful in selectively activating the copper surface of printed circuit boards for the reception of electroless nickel-phosphorous plating thereon.

The current invention proposes the addition of imidazole and imidazole derivatives to activator solutions. The phrase imidazole and imidazole derivatives shall mean imidazole itself and any derivative thereof as follows:

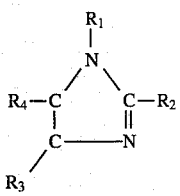

Wherein, $R_1$, $R_2$, $R_3$ and $R_4$ can independently be selected from the group consisting of substituted or unsubstituted alkyl groups, substituted or unsubstituted aryl groups, halogens, nitro groups, and hydrogen.

The activator solutions may include precious metal activator solutions such as those containing palladium, gold, rhodium and other precious metals in solution or in colloidal form. The activator solution may also include non-precious metal activator solutions such as copper, tin or other non-precious metals in solution or in colloidal form.

It has been discovered that the addition of imidazole or imidazole derivatives to the various activator systems promotes the selective activation of certain surfaces without undesirable activation or plating on other surfaces, and without significant detrimental effect to the other properties of the activator. The invention is thus particularly useful in activating certain copper areas of printed circuit boards for reception of electroless nickel-phosphorous plating without activation or plating on undesirable areas.

DETAILED DESCRIPTION OF THE INVENTION

The current invention proposes a new composition and process useful in selectively activating certain metallic surfaces for plating thereon, without concurrently activating other surfaces in proximity to the certain metallic surfaces. As such, the invention is particularly useful in selectively activating copper surfaces on printed circuit boards, particularly areas of connection, for plating thereon, particularly plating with electroless nickel-phosphorous, and without concurrently activating other plastic surfaces such as solder mask surfaces. Thus, the invention provides for defined activation and plating.

The current invention proposes the addition of imidazole and imidazole derivatives to activator solutions. This addition of imidazole and/or imidazole derivatives promotes the selective activation of desired surfaces with activators which would, without the addition of the imidazole or imidazole derivatives, indiscriminately activate all surfaces. The addition of the imidazole or imidazole derivative thus adds the desirable property of selectivity to the activation without detracting from its other properties.

The imidazole or imidazole derivatives, which are useful in the invention, are generally described by the following structures:

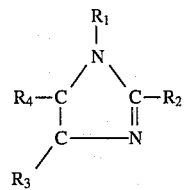

Wherein, $R_1$, $R_2$, $R_3$ and $R_4$ can independently be selected from the group consisting of substituted or unsubstituted alkyl groups, substituted or unsubstituted aryl groups, halogens, nitro groups, and hydrogen.

The activator solutions may include precious metal activator solutions such as those containing palladium, gold, rhodium and other precious metals, in solution or in colloidal form. The activator solutions may also include non-precious metal activator solutions such as copper, tin or other non-precious metals, in solution or in colloidal form.

The activator solutions of the present invention as discussed are useful in activating a variety of metallic surfaces for plating thereon without concurrently activating various plastic surfaces in proximity to the metallic surfaces. Thus the activator solutions are capable of activating a variety of metallic surfaces including copper, nickel, steel, and alloys of the foregoing metals. In addition the activator solutions will not activate various plastic surfaces in proximity to the such metallic surfaces, said plastic surfaces including epoxy, epoxy-glass, epoxy-novolac, polyimide, polyetherimides, polyacrylates, phenolics, and copolymers or blends of the foregoing resins. In particular the activator solutions will not activate soldermask surfaces in proximity to metallic surfaces during the fabrication of printed circuit boards.

A variety of plating solutions may be utilized subsequent to the application of the activator solution. These plating solutions may include electroless nickel-phosphorous, electroless nickel-boron, electroless cobalt-phosphorous, electroless cobalt-boron, electroless copper, and electroless palladium. Thus the activator solutions of the current invention are useful in activating metallic surfaces (such as those recited in the previous paragraph) to be plated with various plating solutions (such as those given above) without concurrent activation of plastic surfaces (such as those recited in the previous paragraph) in proximity to the metallic surfaces.

The composition and process proposed are particularly useful in the production of printed circuits. Once the holes, circuits, and other features of a printed circuit board have been formed and plated through a variety of well-known techniques, the surfaces of the board are frequently coated with a permanent soldermask. The soldermask generally covers all areas of the board except for the areas of connection. These areas of connection are, at this stage, exposed copper surfaces. As part of the invention, the following process is proposed for the selective activation of those surfaces.

1. The printed circuit board with surfaces consisting essentially of soldermask and exposed copper areas is subjected to a chemical cleaner such as MacDermid Planar Acid Cleaner XD-6255-T.
2. The board is then subjected to a microetch such as MacDermid Planar Microetch II XD-6278-T.
3. The board is then activated in an activator solution containing an imidazole or imidazole derivative.
4. The board is then subjected to a nickel-phosphorous plating solution such as MacDermid Planar Electroless Nickel XD-6263-T.
5. The board is finally subjected to a precious metal plating solution such as an electroless gold or palladium plating solution.

Note that clean water rinses are interposed between these chemical operations.

The invention is further described for illustrative purposes only (in no way limiting) in the following specific examples:

EXAMPLE 1

A solution of 50 gr/l sodium chloride and 5 gr/l imidazole was made up and adjusted to an approximate pH of 2.0 with concentrated hydrochloric acid. To that solution was added 50 mg/l palladium ion in the form of palladium chloride in dilute hydrochloric acid. The final pH was 2.1 and the temperature of the solution was set to 130° F. An epoxy-glass based circuit board patterned with soldermask (Mac-Dermid 6000 soldermask which is an epoxy-acrylate copolymer) and having exposed pads, some with associated holes and some without associated holes, was run through the following cycle:

|  | Time | Temp |
| --- | --- | --- |
| 1. MacDermid Planar Acid Cleaner XD-6255-T | 5 min | 120° F. |
| 2. Cold water rinse | 2 min | 60° F. |
| 3. MacDermid Planar Microetch II XD-6278-T | 2 min | 110° F. |
| 4. Cold water rinse | 2 min | 60° F. |
| 5. Activator solution as prepared | 5 min | 130° F. |
| 6. Cold water rinse | 2 min | 60° F. |
| 7. MacDermid Planar Electroless Nickel XD-6263-T | 15 min | 190° F. |
| 8. Cold water rinse | 2 min | 60° F. |
| 9. Dry |  |  |

Inspection of the panel indicated complete coverage of the exposed copper by the electroless nickel-phosphorous, with no evidence of extraneous plating on soldermask areas.

EXAMPLE 2

A patterned circuit board with soldermask, as above, was run through the cycle of Example 1 except that the activator solution was the following:

A solution of 50 gr/l sodium chloride and 1 gr/l 2-methyl imidazole was made up and 50 mg/l of palladium ion was added as a solution of palladium chloride in dilute hydrochloric acid. The pH was adjusted to 2.6 with concentrated hydrochloric acid and the temperature of the bath was set to 120° F.

Complete coverage of the exposed copper was observed with no evidence of extraneous plating.

EXAMPLE 3

A patterned circuit board with soldermask was run, as in Example 2, except that the pH of the solution was set to 2.3 and the temperature was 94° F. Complete coverage of the copper surfaces was observed with no evidence of extraneous plating.

COMPARATIVE EXAMPLE 1

A patterned circuit board with soldermask, as above, was run through the cycle of Example 1 except that the activator solution was the following:

A solution of 10 gr/l sodium glycolate was adjusted to pH 3.0 with concentrated sulfuric acid and 10 gr/l sodium chloride was dissolved in this solution. 100 mg/l palladium ion was added as a solution of palladium chloride in dilute hydrochloric acid. The temperature was set to 92° F.

After plating in the electroless nickel, the copper surfaces were completely covered but massive overplating of the soldermask surface had occurred.

EXAMPLE 4

A patterned circuit board with soldermask, as above, was run as in Comparative Example 1 except that 0.7 gr/l imidazole was added to the activator solution of Comparative Example 1. Copper coverage by the nickel was complete and no extraneous plating on the soldermask was observed.

COMPARATIVE EXAMPLE 2

A patterned circuit board with soldermask, as above, was run through the cycle of Example 1 except that the activator solution was as follows:

A solution of 50 gr/l sodium chloride, 50 mg/l palladium ion from a solution of palladium chloride in dilute hydrochloric acid, and 2 gr/l copper ion from cupric chloride dihydrate was made up and adjusted to a pH of 2.0 with concentrated hydrochloric acid. The temperature was set to 125° F.

Coverage of the exposed copper by nickel was complete, but massive extraneous plating of the soldermask or on the epoxy-glass was observed.

EXAMPLE 5

A patterned circuit board with soldermask as above was run as in comparative Example 2 except that 0.1 gr/l histidine monohydrochloride was added to the activator solution of Comparative Example 2. Coverage of the exposed copper surfaces was complete after nickel plating and no extraneous plating on the soldermask or on the epoxy-glass was observed.

EXAMPLE 6

A patterned circuit board with soldermask, as above, was run through the cycle of Example 1 except that the activator solution was as follows:

A solution of 50 gr/l sodium chloride, 1 gr/l histidine monohydrochloride and 50 mg/l palladium ion from a solution of palladium chloride in dilute hydrochloric acid was prepared. Hydrochloric acid concentrate was added to give an acid normality of 0.15N. The temperature was set at 128° F.

Coverage of the exposed copper surfaces with the nickel was complete and no extraneous plating was observed. The activator solution was repeatedly used in this way. Coverage of the exposed copper with the nickel and the incidence of extraneous plating on the soldermask and epoxy-glass was monitored during the life of the activator solution. A total of 700 surface square feet of printed circuit boards, per gallon of solution, were processed in this manner through the activator solution, during which the copper concentration in the activator solution increased to 2 gr/l. Palladium concentration, sodium chloride concentration and acid concentration were maintained by analysis and replenishment. Histidine monohydrochloride was added to the activator solution in proportion to palladium replenishment. Coverage of copper by nickel was complete throughout the life of the activator solution, and no extraneous plating was observed. Circuit boards run through the test were submitted to solder shock testing and no incidence of adhesion failure was observed.

EXAMPLE 7

A polyimide based circuit board with soldermask was run as in Example 1 except that the exposed pads, holes, lands and circuits were nickel instead of copper and the plating solution was MacDermid M-89 Electroless Copper instead of MacDermid Planar Electroless Nickel XD-6263-T. Coverage of the exposed nickel surfaces with the electroless copper was complete and no extraneous plating was observed on the solder mask or on the polyimide.

EXAMPLE 8

An epoxy-glass based circuit board with soldermask was run as in Example 1 except that the exposed pads, holes, lands and circuits were nickel instead of copper and the plating solution was MacDermid Electroless Palladium instead of MacDermid Planar Electroless Nickel XD-6263-T. Coverage of the exposed nickel surfaces with the electroless palladium was complete and no extraneous plating was observed on the solder mask or on the epoxy-glass.

We claim:

1. A process for the activation of metallic surfaces without the concurrent effective activation of plastic surfaces in proximity to the metallic surfaces, said process comprising contacting the metallic and plastic surfaces with an activator solution said activator solution comprising an imidazole compound described as follows:

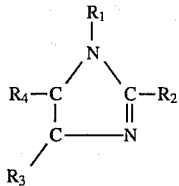

Wherein $R_1$, $R_2$, $R_3$, and $R_4$ are independently selected from the group consisting of substituted or unsubstituted alkyl groups, substituted or unsubstituted aryl groups, halogens, nitro groups and hydrogen and subsequently electrolessly plating said metallic surfaces.

2. A process according to claim 1, wherein the metallic surfaces and the plastic surfaces comprise a printed circuit board comprising soldermask surfaces and exposed copper surfaces.

3. A process according to claim 1, wherein the activator solution further comprises a species selected from the group consisting of palladium ions and palladium in colloidal suspension.

4. A process according to claim 1, wherein the activator solution further comprises palladium ions in aqueous acid solution.

5. A process according to claim 1, wherein the activator further comprises palladium ions and chloride ions in aqueous acid solution.

6. A process according to claim 2, wherein the activator solution further comprises palladium ions in aqueous acid solution.

7. A process according to claim 2, wherein the activator solution further comprises palladium ions and chloride ions in aqueous acid solution.

8. A process according to claim 2, wherein the metallic surfaces are plated with electroless nickel subsequent to being contacted with the activator solution.

9. A process according to claim 2, wherein the activator solution further comprises a species selected from the group consisting of palladium ions and palladium in colloidal suspension.

* * * * *